(12) United States Patent
Chung et al.

(10) Patent No.: US 8,987,037 B2
(45) Date of Patent: Mar. 24, 2015

(54) METHODS OF MANUFACTURING A SOLAR CELL

(71) Applicant: Electronics and Telecommunications Research Institute, Daejeon (KR)

(72) Inventors: Yong-Duck Chung, Daejeon (KR); Dae-Hyung Cho, Seoul (KR); Won Seok Han, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 11 days.

(21) Appl. No.: 13/841,772

(22) Filed: Mar. 15, 2013

(65) Prior Publication Data

US 2014/0120651 A1    May 1, 2014

(30) Foreign Application Priority Data

Oct. 29, 2012 (KR) .................. 10-2012-0120415

(51) Int. Cl.
    *H01L 21/00* (2006.01)
    *H01L 31/18* (2006.01)

(52) U.S. Cl.
    CPC .............. *H01L 31/186* (2013.01); *Y02E 10/50* (2013.01)
    USPC ................... 438/69; 438/46; 438/84; 438/88; 257/103; 257/184; 257/E31.027; 257/E21.068

(58) Field of Classification Search
    CPC ............................................. H01L 31/022425
    USPC ........ 438/46, 84, 88, 590, 102; 257/103, 184, 257/E31.027, E21.068, E33.013
    See application file for complete search history.

(56) References Cited

U.S. PATENT DOCUMENTS 7,179,677 B2    2/2007  Ramanathan et al.
2006/0261383 A1  11/2006 Hashimoto et al.
2010/0233841 A1*  9/2010 Platzer Bjorkman et al. .. 438/85

FOREIGN PATENT DOCUMENTS

KR    10-2012-0098395 A    9/2012

OTHER PUBLICATIONS

Takashi Minemoto et al., "Sputtered ZnO-based buffer layer for band offset control in Cu(In, Ga)Se$_2$ solar cells", Thin Solid Films, Aug. 31, 2011, pp. 7568-7571, vol. 519, Issue 21.

* cited by examiner

*Primary Examiner* — Mark A Laurenzi
(74) *Attorney, Agent, or Firm* — Rabin & Berdo, P.C.

(57) ABSTRACT

A method of manufacturing a solar cell includes forming a buffer layer between an optical absorption layer and a window electrode layer. Forming the buffer layer includes depositing a metal material on the optical absorption layer, supplying a non-metal material on the optical absorption layer, supplying a gas material including oxygen atoms on the optical absorption layer, and reacting the metal material with the non-metal material. The gas material reacts with the metal material and the non-metal material to form a metal sulfur oxide on the optical absorption layer.

18 Claims, 3 Drawing Sheets

METHODS OF MANUFACTURING A SOLAR CELL

CROSS-REFERENCE TO RELATED APPLICATIONS

This U.S. non-provisional patent application claims priority under 35 U.S.C. §119 to Korean Patent Application No. 10-2012-0120415, filed on Oct. 29, 2012, the entirety of which is incorporated by reference herein.

BACKGROUND

The inventive concept relates to methods of manufacturing a solar cell and, more particularly, to methods of manufacturing a solar cell including a buffer layer formed by a vacuum deposition method.

A solar cell directly coverts sunlight into electrical energy. Solar cell techniques have been developed for a large area, low costs, and high efficiency of solar cells.

A thin film solar cell has an energy recovery period shorter than that of a silicon solar cell. Additionally, the thin film solar cell is easily thinned and widened. Thus, manufacturing costs of the thin film solar cell may be remarkably reduced by development of manufacturing techniques. Additionally, various researches have been conducted for CIS-based thin film solar cells using CIS-based thin films of copper-indium-gallium-selenium (Cu—In—Ga—Se) or copper-zinc-tin-selenium (Cu—Zn—Sn—Se) for increasing photoelectric transformation efficiency of the thin film solar cells.

Particularly, the Cu—In—Ga—Se (CIGS) thin film solar cell has photoelectric transformation efficiency greater than that of an amorphous silicon solar cell. Additionally, the CIGS thin film solar cell is stable without an initial deterioration phenomenon. Furthermore, the CIGS thin film solar cell has excellent properties, such that it may be substituted for a conventional single-crystalline silicon solar cell (20 W/kg) and may be developed as a light and high efficiency solar cell used in space. A power per a weight (e.g., about 100 W/kg) of the CIGS thin film solar cell is higher than those of a conventional silicon or GaAs solar cells (about 20 W/kg to about 40 W/kg). However, productivity of the CIGS thin film solar cell is relatively low. This is because there may not be techniques suitable for continuous production of the CIGS thin film solar cells and complex arrangement processing may be used in the production of the CIGS thin film solar cells. Recently, various researches have been conducted for increasing the productivity of the CIGS thin film solar cells.

SUMMARY

Embodiments of the inventive concept may provide methods of easily manufacturing a high efficiency solar cell.

According to exemplary embodiments of the inventive concept, a method of manufacturing a solar cell may include: forming an optical absorption layer on a substrate; forming a buffer layer on the optical absorption layer; and forming a window electrode layer on the buffer layer. Forming the buffer layer may include: depositing a metal material on the optical absorption layer; supplying a non-metal material on the optical absorption layer; supplying a gas material including oxygen atoms on the optical absorption layer; and reacting the metal material with the non-metal material. The gas material including the oxygen atoms may react with the metal material and the non-metal material to form a metal sulfur oxide on the optical absorption layer.

In an embodiment, supplying the non-metal material on the optical absorption layer may include: performing a first thermal treating process to evaporate the non-metal material; and performing a second thermal treating process thermally decomposing the non-metal material into its atoms or molecules at a higher temperature than the first thermal treating process.

In an embodiment, reacting the metal material with the non-metal material may be performed by a thermal treating process diffusing the non-metal material into the metal material.

In an embodiment, the metal material may include at least one of zinc (Zn), indium (In), cadmium (Cd), magnesium (Mg), beryllium (Be), calcium (Ca), and tin (Sn).

In an embodiment, the non-metal material may include at least one of sulfur (S), selenium (Se), and tellurium (Te).

In an embodiment, the gas material including the oxygen atoms may include oxygen, water vapor, hydrogen peroxide, ozone, sulfur oxide, selenium dioxide or any combination thereof.

In an embodiment, the gas material including the oxygen atoms and the non-metal material may be supplied at the same time.

In an embodiment, the metal sulfur oxide may be zinc sulfur oxide.

In an embodiment, the buffer layer may be formed by a vacuum deposition method.

In an embodiment, the buffer layer may be formed by a sputtering method or an evaporation method.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
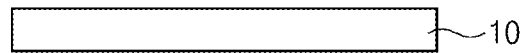
FIGS. 1 to 6 are cross-sectional views illustrating a method of manufacturing a solar cell according to exemplary embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Figure 7:
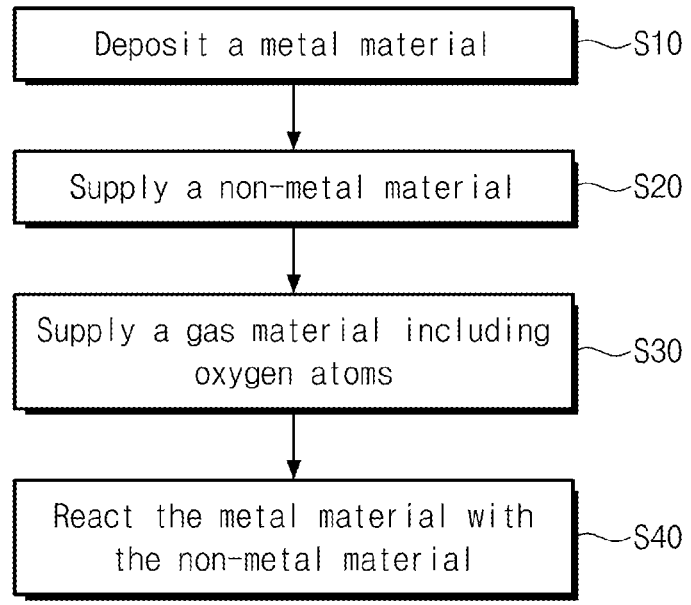
FIG. 7 is a flowchart illustrating a method of forming a buffer layer according to exemplary embodiments of the inventive concept.
Figure 8:
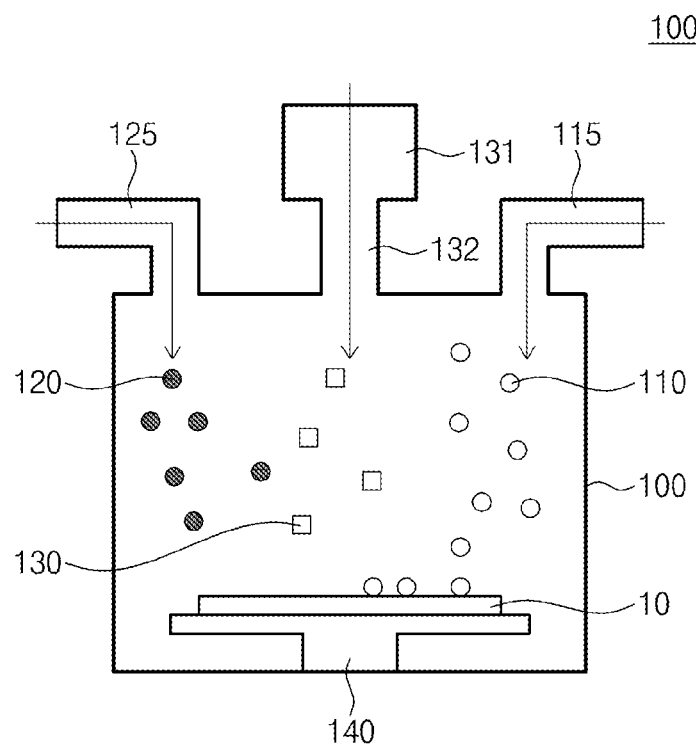
FIG. 8 is a schematic diagram illustrating a vacuum deposition apparatus used for forming a buffer layer according to exemplary embodiments of the inventive concept.

FIGS. 1 to 6 are cross-sectional views illustrating a method of manufacturing a solar cell according to exemplary embodiments of the inventive concept. FIG. 7 is a flowchart illustrating a method of forming a buffer layer according to exemplary embodiments of the inventive concept. FIG. 8 is a schematic diagram illustrating a vacuum deposition apparatus used for forming a buffer layer according to exemplary embodiments of the inventive concept.

Referring to FIG. 1, a substrate 10 may be provided. The substrate 10 may be a glass substrate, a metal plate, or a polymer substrate. For example, the substrate 10 may be a soda lime glass substrate, a stainless metal substrate, or a polyimide polymer substrate.

Figure 2:
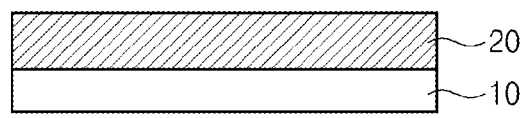

Referring to FIG. 2, a back side electrode 20 may be formed on the substrate 10. The back side electrode 20 may include an opaque metal layer such as molybdenum (Mo). The back side electrode 20 may be formed by a vacuum deposition method such as a sputtering method or an evaporation method.

Figure 3:
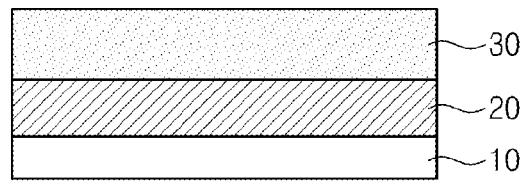

Referring to FIG. 3, an optical absorption layer 30 may be formed on the back side electrode 20. The optical absorption layer 30 may include a chalcopyrite-based compound semiconductor such as $CuInSe$, $CuInSe_2$, $CuInGaSe$, or $CuIn$-$GaSe_2$. The optical absorption layer 30 may be formed by a vacuum deposition method such as a sputtering method or a co-evaporation method.

Figure 4:
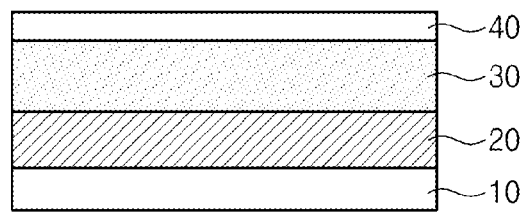

Referring to FIG. 4, a buffer layer 40 may be formed on the optical absorption layer 30. The buffer layer 40 may relax difference between energy band gaps of the optical absorption layer 30 and a window electrode layer formed in a subsequent process. An energy band gap of the buffer layer 40 may be greater than the energy band gap of the optical absorption layer 30 and be less than the energy band gap of the window electrode layer. The buffer layer 40 may include a metal sulfur oxide. For example, the metal sulfur oxide may be zinc sulfur oxide (ZnOS). The buffer layer 90 may have a thickness of about 10 nm to about 200 nm.

The buffer layer 40 may be formed by a vacuum deposition method. Hereinafter, a method of forming the buffer layer 40 will be described with reference to FIGS. 7 and 8 in more detail.

Referring to FIGS. 7 and 8, a metal material 110 is deposited on the substrate 10 (S10). In more detail, the substrate 10 may be provided into a chamber 100 of a vacuum deposition apparatus 1000. The substrate 100 may be a glass substrate, a metal plate, or a polymer substrate. As illustrated in FIG. 3, the substrate 10 may include the back side electrode 20 and the optical absorption layer 30. The metal material 110 may be provided into the chamber 100 through a metal material supplying part 115. For example, the metal material 110 may include at least one of zinc (Zn), indium (In), cadmium (Cd), magnesium (Mg), beryllium (Be), calcium (Ca), and tin (Sn). The metal material 110 may be formed on the substrate 10 by a vacuum deposition method such as a sputtering method or an evaporation method.

Subsequently, a non-metal material 130 is supplied into the chamber 100 (S20). The non-metal material 130 may be provided into the chamber 100 through a non-metal material supplying part 131 and a non-metal material pyrolysis unit 132. For example, the non-metal material 130 may include at least one of sulfur (S), selenium (Se), and tellurium (Te). A first thermal treating process may be performed in the non-metal supplying part 131, so that the non-metal material 130 may evaporate. For example, the first thermal treating process may be performed at a temperature of about 200 degrees Celsius to about 500 degrees Celsius. The non-metal material pyrolysis unit 132 may decompose the non-metal material 130 into its atoms or molecules. A second thermal treating process may be performed in the non-metal material pyrolysis unit 132, so that the non-metal material 130 may be thermally decomposed into the atoms or molecules and then the atoms or molecules may be supplied into the chamber 100. The second thermal treating process may be performed at a temperature higher than the temperature of the first thermal treating process. For example, the second thermal treating process may be performed at a temperature of about 500 degrees Celsius to about 1100 degrees Celsius.

Next, a gas material 120 including oxygen atoms is supplied into the chamber 100 (S30). The gas material 120 including the oxygen atoms may be supplied into the chamber 100 through a gas material supplying part 125. For example, the gas material 120 including the oxygen atoms may include oxygen, water vapor, hydrogen peroxide, ozone ($O_3$), sulfur oxide (SO, $SO_2$, $SO_3$, $S_2O_3$, $S_2O_7$, or $SO_4$), selenium dioxide ($SeO_2$) or any combination thereof. The gas material 120 including the oxygen atoms may further include an additional material controlling a partial pressure of the oxygen atoms within the chamber 100. The additional material does not participate in a reaction of the materials. For example, the additional material may include at least one of argon (Ar), neon (Ne), or nitrogen (N). In other embodiments, the gas material 120 including the oxygen atoms may be supplied into the chamber 100 before the supply of the non-metal material 130 or may be supplied together with the non-metal material 130 at the same time.

Thereafter, the non-metal material 130 reacts with the metal material 110 deposited on the substrate 10 (S40). In more detail, a heating part 140 may be disposed in the chamber 100. The heating part 140 may support the substrate 10. A third thermal treating process may be performed by the heating part 140, so that the non-metal material 130 may be uniformly diffused into the metal material 110 deposited on the substrate 100 and then may react with the metal material 110. For example, the third thermal treating process may be performed at a temperature of about 100 degrees Celsius to about 600 degrees Celsius. The gas material 120 including the oxygen atoms may react with the thermally decomposed non-metal material 130 to form an oxide and then the oxide may react with the metal material 110. Alternatively, the gas material 120 including the oxygen atoms may react with a compound formed by the reaction of the non-metal material 130 and the metal material 110. Thus, the buffer layer 40 may be formed to have the non-metal material 130 and the gas material 120 combined with the metal material 110 by the vacuum deposition method. For example, the buffer layer 40 may be a metal sulfur oxide such as zinc sulfur oxide (ZnOS).

According to embodiments of the inventive concept, the buffer layer 40 including the metal sulfur oxide is formed by the vacuum deposition method, such that productivity of the high efficiency solar cell may increase or be maximized.

Figure 5:
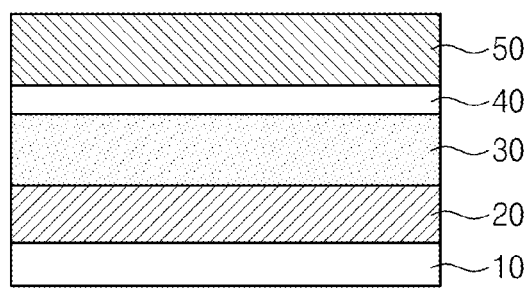

Referring to FIG. 5, the window electrode layer 50 may be formed on the buffer layer 40. The window electrode layer 50 may include indium-tin oxide or zinc oxide. Alternatively, the window electrode layer 50 may include a metal oxide layer and a metal layer. The window electrode layer 50 may be formed by a vacuum deposition method such as a PVD method.

Figure 6:
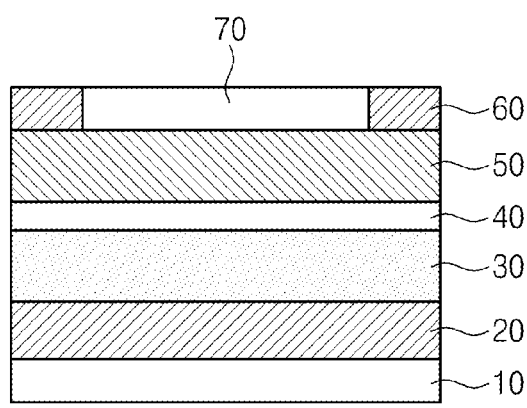

Referring to FIG. 6, a grid 60 and an anti-reflection layer 70 may be formed on the window electrode layer 50. The grid 60 may release electrons generated in the optical absorption layer 30. The grid 60 may be electrically connected to the window electrode layer 50. For example, the grid 60 may include at least one metal layer such as gold (Au), silver (Ag), aluminum (Al), and/or indium (In). The grid 60 may be formed using a vacuum deposition method such as a sputtering method and an evaporation method. The anti-reflection layer 70 may prevent reflection of sunlight incident on the optical absorption layer 30. For example, the anti-reflection layer 70 may include magnesium fluoride ($MgF_2$). The anti-reflection layer 70 may be formed using a vacuum deposition method such as a sputtering method or an evaporation method.

According to embodiments of the inventive concept, the buffer layer 40 including the metal sulfur oxide is formed by the vacuum deposition method. Thus, the manufacturing processes from the back side electrode 20 to the grid 60 and the anti-reflection layer 70 may be sequentially performed using the vacuum deposition methods. Thus, the high efficiency solar cell including the metal sulfur oxide may be easily manufactured.

According to embodiments of the inventive concept, the buffer layer is formed by the vacuum deposition method. Thus, the manufacturing processes of the high efficiency solar cell may be sequentially performed using the vacuum deposition methods. As a result, the high efficiency solar cell may be easily manufactured.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of manufacturing a solar cell comprising:
   forming an optical absorption layer on a substrate;
   forming a buffer layer on the optical absorption layer; and
   forming a window electrode layer on the buffer layer;
   wherein forming the buffer layer includes:
      depositing a metal material on the optical absorption layer;
      supplying a non-metal material on the optical absorption layer;
      supplying a gas material including oxygen atoms on the optical absorption layer; and
      reacting the metal material with the non-metal material;
   wherein the gas material including the oxygen atoms reacts with the metal material and the non-metal material to form a metal sulfur oxide on the optical absorption layer; and
   wherein supplying the non-metal material on the optical absorption layer includes:
      performing a first thermal treating process to evaporate the non-metal material; and
      performing a second thermal treating process thermally decomposing the non-metal material into its atoms or molecules at a higher temperature than the first thermal treating process.

2. The method of claim 1, wherein reacting the metal material with the non-metal material is performed by a thermal treating process diffusing the non-metal material into the metal material.

3. The method of claim 1, wherein the metal material includes at least one of zinc (Zn), indium (In), cadmium (Cd), magnesium (Mg), beryllium (Be), calcium (Ca), and tin (Sn).

4. The method of claim 1, wherein the non-metal material includes at least one of sulfur (S), selenium (Se), and tellurium (Te).

5. The method of claim 1, wherein the gas material including the oxygen atoms includes oxygen, water vapor, hydrogen peroxide, ozone, sulfur oxide, selenium dioxide or any combination thereof.

6. The method of claim 1, wherein the gas material including the oxygen atoms and the non-metal material are supplied at the same time.

7. The method of claim 1, wherein the metal sulfur oxide is zinc sulfur oxide.

8. The method of claim 1, wherein the buffer layer is formed by a vacuum deposition method.

9. The method of claim 8, wherein the buffer layer is formed by a sputtering method or an evaporation method.

10. A method of manufacturing a solar cell comprising:
    forming an optical absorption layer on a substrate;
    forming a buffer layer on the optical absorption layer; and
    forming a window electrode layer on the buffer layer;
    wherein forming the buffer layer includes:
       depositing a metal material on the optical absorption layer;
       supplying a non-metal material on the optical absorption layer;

supplying a gas material including oxygen atoms on the optical absorption layer; and reacting the metal material with the non-metal material;

wherein the gas material including the oxygen atoms reacts with the metal material and the non-metal material to form a metal sulfur oxide on the optical absorption layer; and wherein reacting the metal material with the non-metal material is performed by a thermal treating process diffusing the non-metal material into the metal material.

11. The method of claim 10, wherein supplying the non-metal material on the optical absorption layer includes:

performing a first thermal treating process to evaporate the non-metal material; and performing a second thermal treating process thermally decomposing the non-metal material into its atoms or molecules at a higher temperature than the first thermal treating process.

12. The method of claim 10, wherein the metal material includes at least one of zinc (Zn), indium (In), cadmium (Cd), magnesium (Mg), beryllium (Be), calcium (Ca), and tin (Sn).

13. The method of claim 10, wherein the non-metal material includes at least one of sulfur (S), selenium (Se), and tellurium (Te).

14. The method of claim 10, wherein the gas material including the oxygen atoms includes oxygen, water vapor, hydrogen peroxide, ozone, sulfur oxide, selenium dioxide or any combination thereof.

15. The method of claim 10, wherein the gas material including the oxygen atoms and the non-metal material are supplied at the same time.

16. The method of claim 10, wherein the metal sulfur oxide is zinc sulfur oxide.

17. The method of claim 10, wherein the buffer layer is formed by a vacuum deposition method.

18. The method of claim 17, wherein the buffer layer is formed by a sputtering method or an evaporation method.

* * * * *